United States Patent
Diamant

(10) Patent No.: US 9,858,042 B1
(45) Date of Patent: Jan. 2, 2018

(54) CONFIGURABLE RING OSCILLATOR

(71) Applicant: AMAZON TECHNOLOGIES, INC., Seattle, WA (US)

(72) Inventor: Ron Diamant, Albany, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/274,585

(22) Filed: Sep. 23, 2016

(51) Int. Cl.
*G06F 7/58* (2006.01)
*H03K 3/03* (2006.01)

(52) U.S. Cl.
CPC .......... *G06F 7/588* (2013.01); *H03K 3/0315* (2013.01)

(58) Field of Classification Search
CPC .................. G06F 7/588; H03K 3/0315
USPC .................................. 708/250–256
See application file for complete search history.

(56) References Cited

U.S. PATENT DOCUMENTS

| | | | | |
|---|---|---|---|---|
| 2011/0128081 A1* | 6/2011 | Hars | .................. | G06F 7/588 331/57 |
| 2011/0131263 A1* | 6/2011 | Vasyltsov | .............. | G06F 7/588 708/251 |
| 2011/0302232 A1* | 12/2011 | Vasyltsov | .............. | G06F 7/588 708/251 |
| 2014/0244702 A1* | 8/2014 | Karpinskyy | ............ | G06F 7/588 708/251 |

\* cited by examiner

*Primary Examiner* — Tan V. Mai
(74) *Attorney, Agent, or Firm* — Blank Rome LLP

(57) ABSTRACT

A device includes configurable parallel connected ring oscillators and a finite state machine coupled to the ring oscillators. The finite state machine is configured to cause each of the ring oscillators to operate in an accumulate entropy state for a first period of time and a break phase lock state for a second period of time. When operating in the accumulate entropy state, all of the ring oscillators are in the same configuration. When operating in the break phase lock state, each ring oscillator is in a different configuration than the other ring oscillators.

20 Claims, 5 Drawing Sheets

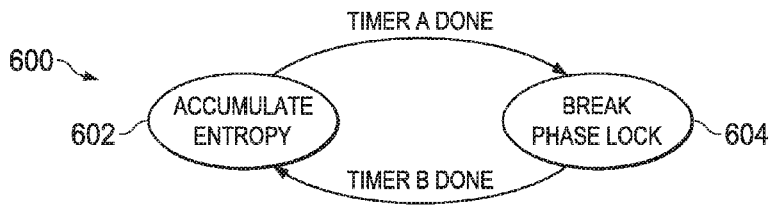
FIG. 6
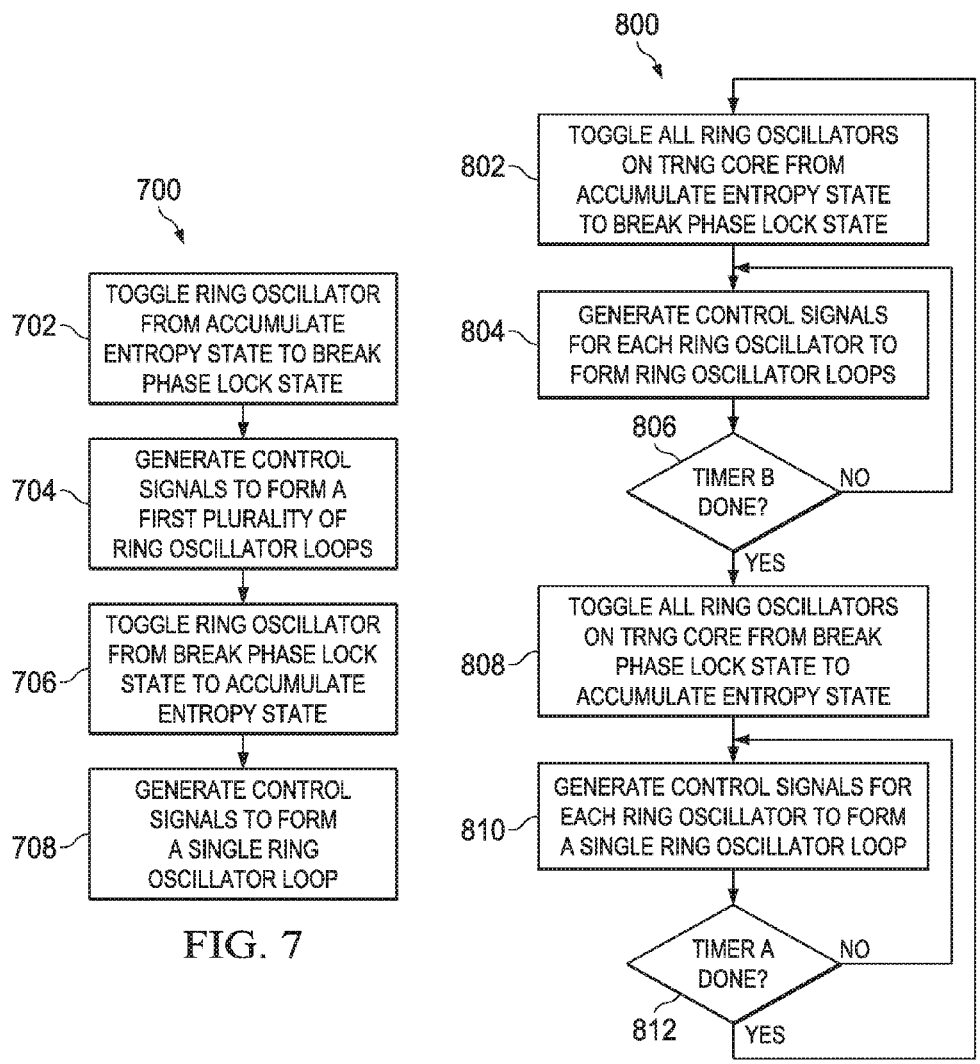
FIG. 7
FIG. 8

CONFIGURABLE RING OSCILLATOR

BACKGROUND

The security of many systems, such as cryptographic systems, relies on unpredictability and irreproducibility of digital key-streams that are used for encryption and/or signing of confidential information. There are at least two fundamentally different strategies for generating random bits. One strategy is to compute numbers deterministically using, for example, a software-implemented algorithm that requires an initial input seed value. This class of random number generators is known as Pseudo/Deterministic Random Number Generators (PRNGs/DRNG). PRNGs must be provided with a random initialization value (seed) to produce an output value that resembles a random bit-stream. PRNGs are periodic, although the periods are typically very long.

Another strategy is to produce bits non-deterministically, where every bit of output is based on a physical process that is unpredictable. Such physical processes may be based, for example, on the production of thermal (resistance or shot) noise. This class of Random Number Generators (RNGs) is commonly known as True Random Number Generators (TRNGs). In hybrid RNG implementations, often a TRNG is used to initialize the PRNG (e.g., provide the seed for the PRNG).

BRIEF DESCRIPTION OF THE DRAWINGS

For a detailed description of various examples, reference will now be made to the accompanying drawings in which:

FIG. 6 shows an illustrative state diagram of states provided by a finite state machine of a controller configured to break phase lock between ring oscillators in a TRNG core in accordance with various embodiments;

FIG. 7 shows a flow diagram illustrating aspects of operations that may be performed to break a phase lock between ring oscillators in a TRNG core in accordance with various embodiments;

FIG. 8 shows a flow diagram illustrating aspects of operations that may be performed to break a phase lock between ring oscillators in a TRNG core in accordance with various embodiments.

DETAILED DESCRIPTION

Figure 1:
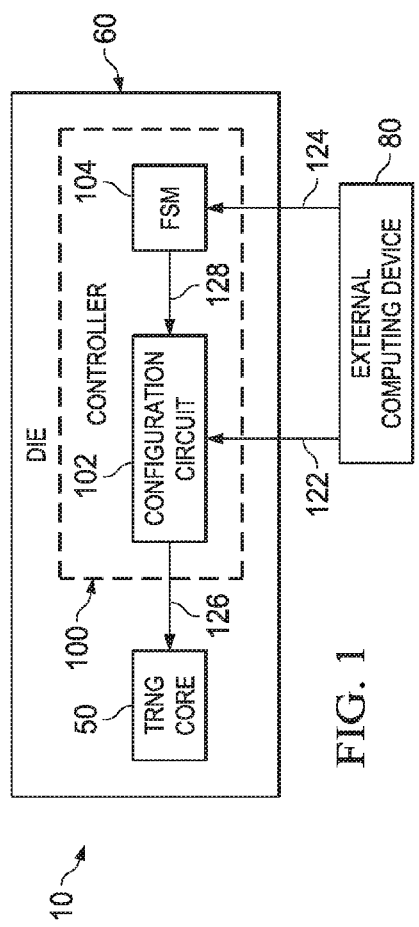
FIG. 1 shows an illustrative block diagram of a system in which a TRNG core is coupled to a controller configured to break a phase lock between ring oscillators in the TRNG core in accordance with various embodiments.

Random number generators (RNGs) produce random binary numbers, which may be statistically independent, uniformly distributed and unpredictable. Random numbers are useful in many applications such as cryptography, communications, probabilistic algorithms, and so on. In particular, many cryptographic applications benefit from relatively high entropy. By way of illustration, if a 128-bit key is generated with only 64-bits of entropy then the encrypted value can be guessed on average in $2^{63}$ attempts. However, if 128 bits of entropy are used, then it will take on average $2^{127}$ attempts to guess correctly the encrypted value. Using 128 bits as opposed to 64 bits is a very significant difference, in many cases making it infeasible to correctly guess the encrypted value. As a consequence, many applications benefit from an embedded, high-quality RNG.

As noted above, often a TRNG is used to initialize a PRNG. Regardless of how or why they are used, TRNGs are based on a physical noise source (e.g., radioactive decay, thermal noise or free running jitter oscillators) and depend strongly on the quality of their implementation. Production of high rate and high quality random bit-streams inside logic-devices is challenging because such devices are usually intended for implementing deterministic data processing algorithms, whereas generating true-randomness generally needs some physical nondeterministic process.

Many conventional TRNGs are implemented utilizing multiple parallel ring oscillators. A ring oscillator includes an odd number (1, 3, 5, etc.) of inverters coupled in a ring configuration. In these implementations, several ring oscillators of the same length (i.e., all of the ring oscillators have the same number of inverters) operate in parallel. The outputs of all of the ring oscillators are combined utilizing an exclusive-OR (XOR) tree and then sampled, sometimes utilizing a pair of back-to-back flip-flops. Each inverter causes a deterministic delay in the signal (e.g., 10 ps) and a nondeterministic delay in the signal (e.g., 1 ps). For example, random terminal noise which is introduced into each inverter because electrons within the inverters move in random directions. This causes random small peaks in current of different strengths to flow through each inverter. Hence, truly random variations occur in the delay through each inverter. As the signal traverses through the inverters of each of the parallel ring oscillators, the nondeterministic delay accumulates until the phase in each of the ring oscillators is nondeterministic. Therefore, after waiting for a certain period of time for the random phase to sufficiently accumulate in each of the ring oscillators, the outputs are combined by the XOR tree producing random transitions. The output of the XOR tree is sampled to produce a single random output bit. This process may be repeated to produce a series of randomized bits.

However, the phases generated by conventional multiple parallel ring oscillators tend to interlock (i.e., each of the ring oscillators exhibit similar phases to one another) due to cross capacitance and other similar effects. In other words, the cross capacitance between the different ring oscillators in the TRNG is far stronger than the random effects generated in each inverter. Therefore, the phases of each of the ring oscillators in the TRNG tend to interlock resulting in the outputs of all of the parallel ring oscillators tending to toggle between LOW and HIGH at approximately the same time thereby removing much of the randomness that has accumulated in the phase of the ring oscillator. To prevent cross capacitance, and thus interlock, between the ring oscillators of the TRNG, a physical isolator mechanism could be included between the ring oscillators to prevent any physical effects from creating the interlock. An adequate isolation mechanism may be difficult and expensive to achieve. The disclosed embodiments instead break and/or prevent the dependency between ring oscillators in a TRNG utilizing a deadlock prevention control circuit (FSM) and a set of configurable ring oscillators.

In accordance with the disclosed principles, a TRNG includes a configurable controller which operates to control the configuration of multiple parallel connected ring oscillators based on two states. In the first state, the accumulate entropy state, each of the ring oscillators is configured to a series-connected inverter chain of the same length as the other ring oscillators (i.e., all of the ring oscillators have ring oscillators configured to include the same number of inverters). Thus, during the accumulate entropy state, each of the ring oscillators has the same configuration as the other ring oscillators in the TRNG. The outputs of all of the ring oscillators are combined utilizing an XOR tree and then sampled, using, for example, a synchronizer (e.g., a pair of flip-flops) to generate a random bit.

However, in the second state, the break phase lock state, at least one of the ring oscillators, and in some embodiments all of the ring oscillators, are reconfigured such that the ring oscillators do not all have the same configuration. In other words, during the break phase lock state, each of the ring oscillators may be configured and/or reconfigured differently from each other. For example, one ring oscillator may be reconfigured as a single inverter oscillator followed by two 3-inverter oscillators, while another ring oscillator is reconfigured as nine single inverter oscillators. Thus, during the break phase lock state, each ring oscillator may generate signals with different phases and different periods from one another. This breaks any dependency between the ring oscillators so that the phases generated by each of the ring oscillators do not become interlocked. After a certain amount of time (configurable or fixed), the controller reverts back to the accumulate entropy state, and all of the ring oscillators of the TRNG are again configured to couple together the same number of inverters to form the ring oscillators. In this way, the amount of entropy generated by the TRNG circuit is increased due to reduced interlocking between the different ring oscillators.

FIG. 1 shows an illustrative block diagram of a system 10 in which a TRNG core 50 is coupled to a controller 100 configured to break a phase lock between ring oscillators in the TRNG core 50 in accordance with various embodiments. The TRNG core 50 and the controller 100 may be provided on a die 60. Thus, in this example, the controller 100 is formed on the same die as the TRNG core 50 it is configured to control, although in other examples the controller 100 and the TRNG core 50 it is configured to control may be formed on different dies. Die 60 may be a semiconducting material (e.g., silicon or gallium arsenide GaAs) on which the TRNG core 50 and, in some embodiments, the controller 100 are fabricated.

The TRNG core 50 may be implemented as a circuit which includes any of a variety of different TRNGs, and some of the various TRNGs are described below and shown in various figures. The controller 100 can be customized (i.e., programmed) to configure individual TRNG core configurations or the same controller can be used to configure a variety of different TRNG core configurations. Further, in one example, a system includes multiple (and possibly different) TRNG cores and the controller can selectively configure each core.

The controller 100 of FIG. 1 includes a configuration circuit 102 and a finite state machine (FSM) 104. The FSM 104 controls the configuration circuit 102 to configure and/or reconfigure the TRNG core 50 (e.g., each individual ring oscillator within a multi-ring oscillator TRNG core).

The configuration circuit 102 asserts appropriate control signals 126 to the TRNG core to configure the ring oscillators of the TRNG core for one of two states noted above—the accumulate entropy state and the break phase lock state.

The FSM 104 controls the operation of the configuration circuit 102 by providing the timing of when the configuration circuit 102 should assert control signals 126 to configure and/or reconfigure the ring oscillators of the TRNG core 50. For example, the FSM 104 may toggle between two states, the accumulate entropy state and the break phase lock state. As the FSM 104 toggles from the break phase lock state to the accumulate entropy state, control signal 128 is generated by the FSM 104 and provided to configuration circuit 102. Configuration circuit 102 then asserts the control signal 126 to the TRNG core 50 causing the ring oscillators in the TRNG core 50 to be configured for the accumulate entropy configuration. Similarly, as the FSM 104 toggles to the break phase lock state from the accumulate entropy state, control signal 128 is generated by the FSM 104 and provided to the configuration circuit 102. Configuration circuit 102 then asserts the control signal 126 to the TRNG core 50 causing the ring oscillators in the TRNG core 50 to be configured for the break phase lock configuration. The FSM 104 may continue to cycle between the break phase lock state and the accumulate entropy state.

External computing device 80 is, in an embodiment, connected to the controller 100 to enable programming of the configuration circuit 102 and the FSM 104. External computing device 80 may be any computing device that may provide configuration parameters to configuration circuit 102 and FSM 104. In some embodiments, the configuration circuit 102 and the FSM 104 may be programmed during manufacturing of the controller 100. In some embodiments, the configuration circuit 102 and the FSM 104 may be programmed after manufacturing of the controller 100 and/or reprogrammed after the manufacturing of the controller 100.

The external computing device 80 may provide configuration parameters 124 to the FSM 104 which may define the period of time that the FSM 104 is to operate in the accumulate entropy state and the break phase lock state. In some embodiments, the period of time for operations in the accumulate entropy state is longer or shorter than the clock time for the break phase lock state. In other embodiments, the period of time for operations in the accumulate entropy state is equal to the period of time for operations in the break phase lock state. Thus, for example, the external computing device 80 may provide configuration parameters 124 may instruct the FSM 104 to maintain the accumulate entropy state for 5 seconds and the break phase lock state for 2 seconds. In this example, the external computing device 80 may generate the configuration parameters 124 which is received by the FSM 104. Two timers may then control the toggling of FSM 104. Once the FSM 104 toggles from the break phase lock state to the accumulate entropy state, one timer will time 5 seconds. Once the 5 seconds are complete, the FSM 104 will toggle to the break phase lock state. The second timer will time for 2 seconds. Once the 2 seconds are complete, the FSM 104 will toggle to the accumulate entropy state, and the process then may continue. As discussed above, the external computing device 80 may provide additional configuration parameters 124 that instruct the FSM 104 to change the accumulate entropy period of time and/or the break phase lock period of time.

The external computing device 80 may also provide configuration parameters 122 to the configuration circuit 102 which may define the configurations for the ring oscillators in the TRNG core 50 during the accumulate entropy state and the break phase lock state. For example, the external computing device 80 may provide configuration parameters 122 to the configuration circuit 102 which may instruct the configuration circuit 102 to configure each of the ring oscillators in the TRNG core 50 with a number of series connected inverters of the same length (e.g., all of the ring oscillators have 7 inverters) during the accumulate entropy state. Thus, once the configuration circuit 102 receives signal 128 from FSM 104 indicating that the FSM 104 has toggled to the accumulate entropy state, the configuration circuit 102 will assert the control signal 126 which will cause each of the ring oscillators in the TRNG core 50 to be configured to include, for example, 7 connected inverters in series ring configuration. The external computing device 80 may also provide configuration parameters 122 to the configuration circuit 102 which may instruct the configuration circuit 102 to configure the ring oscillators in the TRNG core 50 such that the ring oscillators do not have the same configuration as each other during the break phase lock state. Thus, once the configuration circuit 102 receives signal 128 from FSM 104 indicating that the FSM 104 has toggled to the break phase lock state, the configuration circuit 102 will assert the control signal 126 which will cause each of the ring oscillators in the TRNG core 50 to reconfigure such that the ring oscillators do not have the same configuration as each other.

Figure 2:
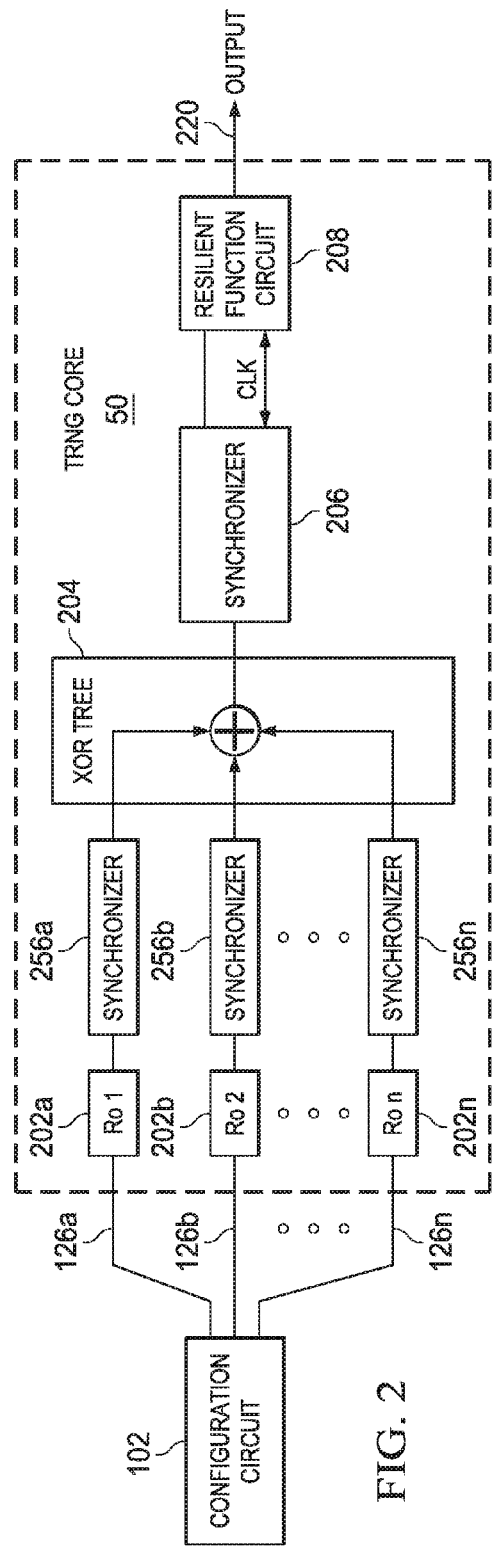
FIG. 2 shows an illustrative block diagram of a TRNG core and a configuration circuit of a controller configured to control configurations of ring oscillators in the TRNG core in accordance with various embodiments.

FIG. 2 shows an illustrative block diagram of TRNG core 50 and configuration circuit 102 of a controller 100 configured to control configurations of ring oscillators in the TRNG core in accordance with various embodiments. The TRNG core 50 may include a number of ring oscillators 202a-n connected in parallel (the ellipsis between the ring oscillators 202b and 202n indicates that the TRNG core 50 may support any suitable number of ring oscillators although only three are shown for clarity), synchronizers 256a-n, an XOR tree 204, a synchronizer 206, and a resilient function circuit 208. As discussed above, the configuration circuit 102 is configured to generate configuration control signals 126a-n that are configured to control the configuration of the ring oscillators 202a-n. For example, control signal 126a is a control signal that controls the configuration of ring oscillator 202a. Similarly, control signal 126b controls the configuration of ring oscillator 202b while control signal 126n controls the configuration of ring oscillator 202n.

While operating in the accumulate entropy state, the control signals 126a-n are configured to control the configuration of ring oscillators 202a-n such that the ring oscillators 202a-n are in the same configuration. For example, control signals 126a-n may cause each ring oscillator 202a-n to be arranged with, for example, 7 inverters connected in series in a single ring oscillator loop during the accumulate entropy state. While operating in the break phase lock state, however, the control signals 126a-n are configured to control the configuration of ring oscillators 202a-n such that the ring oscillators have different configurations from one ring oscillator to another. For example, during the break phase lock state, ring oscillator 202a may have a different configuration than ring oscillators 202b-n. Similarly, ring oscillator 202b may have a different configuration than ring oscillators 202a and 202n.

In some embodiments, synchronizers 256a-n are configured to synchronize the ring oscillator 202a-n outputs prior to being provided to XOR tree 204. The synchronizers 256a-n may include a pair of D flip-flops which capture the value of the ring oscillator 202a-n outputs, respectively, at a definite portion of the clock cycle. Thus, the inputs into the XOR tree 204 are a synchronized version of the ring oscillator 202a-n outputs. The XOR tree 204 may contain a tree of XOR logic gates that are configured to perform a series of exclusive-or logical operations on the ring oscillator 202a-n outputs. For example, one XOR gate in the XOR tree 204 may receive the outputs of ring oscillators 202a and 202b. The output of this XOR gate is HIGH if the output of ring oscillator 202a is different from the ring oscillator 202b (i.e., if the output of ring oscillator 202a is HIGH and the output of ring oscillator 202b is LOW or if the output of ring oscillator 202a is LOW and the output of ring oscillator 202b is HIGH) and the output is LOW if the output of ring oscillator 202a is the same as the output of ring oscillator 202b (i.e., if the output of ring oscillator 202a is HIGH and the output of ring oscillator 202b is HIGH or if the output of ring oscillator 202a is LOW and the output of ring oscillator 202b is LOW). A second XOR gate in the XOR tree 204 may receive the outputs of other ring oscillators (such as ring oscillator 202n and another ring oscillator) and output a signal after performing an XOR operation on those signals. A third XOR gate then may perform an XOR operation of the outputs of the two XOR gates to generate a single XOR tree 204 output signal.

Synchronizer 206 is utilized to sample the output of the XOR tree 204 at various times. In some embodiments, synchronizer 206 is a pair of D flip-flops which captures the value of the XOR tree 204 output at a definite portion of the clock cycle which becomes the output value Q. The resulting bit is random. The resilient function circuit 208 receives the random output bit from the synchronizer 206 and is configured to perform a resilient function (e.g., an exposure-resilient function) on the random bits to compress the output bit-stream 220 and thus enhance the amount of entropy per bit.

In some embodiments, the outputs of the ring oscillators 202a-n are sampled during the accumulate entropy state only, while in other embodiments, the outputs of the ring oscillators 202a-n are sampled during both the accumulate entropy state and the break phase lock state. Thus, the external computing device 80 may also provide configuration parameters to the controller 100 to configure the TRNG core 50 as to whether to sample ring oscillator 202a-n outputs during just the accumulate entropy state or during both the accumulate entropy and break phase lock state.

Figure 3:
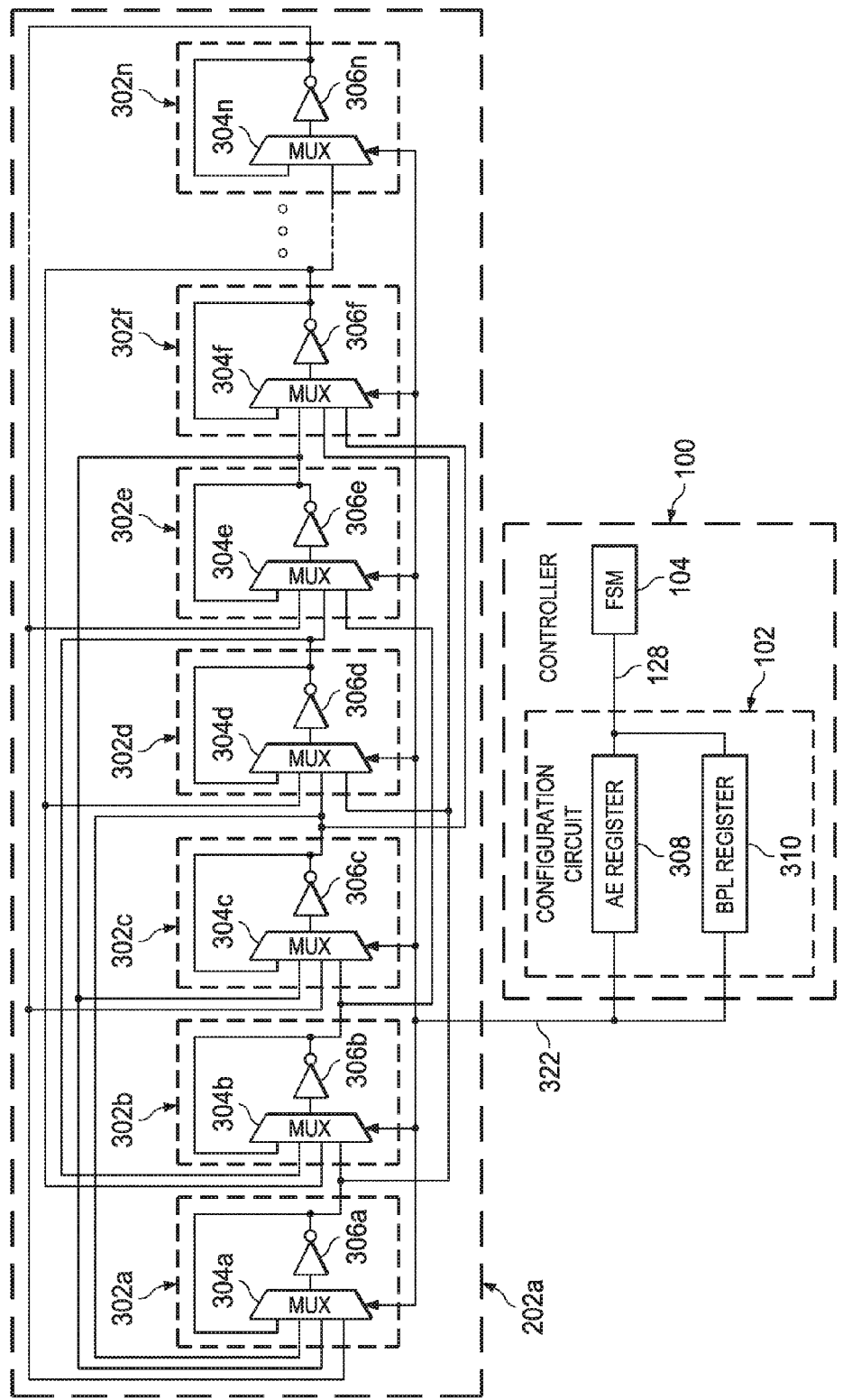
FIG. 3 shows an illustrative circuit diagram of a ring oscillator of a TRNG core and its interactions with a controller in accordance with various embodiments.

FIG. 3 shows an illustrative circuit diagram of a ring oscillator 202a of the TRNG core 50 and its interactions with controller 100 in accordance with various embodiments. The ring oscillator 202a may include a number of ring oscillator elements 302a-n (the ellipsis between the ring oscillator elements 302a-n indicates that the ring oscillator 202a may support any suitable number of ring oscillator elements although only seven are shown for clarity). As used in this disclosure, a ring oscillator element includes a multiplexer directly connected to an input of an inverter. Thus, each of ring oscillator elements 302a-n includes a multiplexer and an inverter. Thus, oscillator element 302a includes multiplexer 304a and inverter 306a; oscillator element 302b includes multiplexer 304b and inverter 306b; oscillator element 302c includes multiplexer 304c and inverter 306c; oscillator element 302d includes multiplexer 304d and inverter 306d; oscillator element 302e includes multiplexer 304e and inverter 306e; oscillator element 302f includes multiplexer 304f and inverter 306f; and oscillator element 302n includes multiplexer 304n and inverter 306n.

Each multiplexer 304a-n is controlled by a select signal 322 (which, in some embodiments, is a part of control signals 126). The select signal 322 is controlled from either an accumulate entropy (AE) register 308 or break phase lock (BPL) register 310 in the configuration circuit 102 of the controller 100. When the FSM 104 toggles into the accumulate entropy state, the AE register 308 controls the select signal 322 and thus controls the multiplexers 304a-n. However, when the FSM 104 toggles into the break phase lock state, the BPL register 310 controls the select signal 322 and thus controls the multiplexers 304a-n. In some embodiments, each bit of the AE register 308 and the BPL register 310 controls a separate multiplexer. For example, if the ring oscillator 202a includes 7 multiplexers and 7 inverters, the AE register 308 and the BPL register 310 will be 7 bits, each bit controlling one multiplexer. In some embodiments, a separate AE register and a separate BPL register control the multiplexers of each ring oscillator 202a-n. For example, AE register 308 and BPL register 310 control the multiplexers 304a-n of ring oscillator 202a while a separate AE register and a separate BPL register may control the multiplexers of ring oscillator 202b. Thus, if there are 8 parallel ring oscillators 202a-n in the TRNG core 50, then there may be 8 AE registers and 8 BPL registers.

Through the AE register 308, the BPL register 310, and multiplexers 304a-304n, the ring oscillator elements 302a-302n may be connected together in various configurations. For example, during the accumulate entropy state, the AE register 308 may assert signal 322 to the multiplexers 304a-n for each of the multiplexers 304a-n to select, as a multiplexer output signal, the previous inverter output signal. Thus, in this example, the multiplexer 304b would select the output of inverter 306a as the input to inverter 306b. Similarly, the multiplexer 304c would select the output of inverter 306b as the input to inverter 306c. In this configuration, the ring oscillator 202a, when operating in the accumulate entropy state, operates as a number of series connected inverters in a single loop. The remaining ring oscillators 202b-n may also be configured in the same manner through their respective AE register during the accumulate entropy state with the same number of inverters as ring oscillator 202a. Thus, all of the ring oscillators 202a-n, when operating in the accumulate entropy state, have the same configuration. In alternative embodiments, the ring oscillators 202a-n may be configured in other configurations, but they all will have the same configuration during the accumulate entropy state. Thus, the system will accumulate entropy and generate random numbers during the accumulate entropy state.

During the break phase lock state, the BPL register 310 may provide assert signal 322 to the multiplexers 304a-n to configure/reconfigure the ring oscillator elements 302a-n into a different configuration (e.g., a configuration that is not a single ring oscillator with inverters in series with one another). For example, as shown in FIG. 3, the multiplexer 304a receives as input the output of the inverter 306a and the output of the inverter 306n. The select signal 322 may cause the multiplexer 304a to select as input for inverter 306a the output of inverter 306a. Thus, the ring oscillator element 302a acts as a single ring oscillator (a ring oscillator loop with a single inverter). Similarly, the multiplexer 304b receives as input the output of inverter 306a, the output of inverter 306b, the output of inverter 306d, and the output of inverter 306f. The select signal 322 may select any of these signals as the input into inverter 306b based on the bit that controls multiplexer 304b in BPL register 310. If the select signal selects the input signal from the output of the inverter 306d, the three inverters 306b-d may combine to create a series connected ring oscillator with 3 inverters (a single ring oscillator loop with 3 inverters). In this way, the ring oscillator elements 302a-n may be configured in a variety of different manners (e.g., 7 single ring oscillators loops, 2 single ring oscillator loops and a series connected ring oscillator loop with 5 inverters, and a single ring oscillator loop and 2 series connected ring oscillator loops with 3 inverters, etc.). In some embodiments, in order to ensure that a transition occurs in the input signals, each of the ring oscillator loops formed by the ring oscillator 202a has an odd number of inverters. Thus, if the input is HIGH, the output will be LOW and vice versa.

The remaining ring oscillators 202b-n may also be configured in the same manner through their respective BPL register during the break phase lock state. However, the ring oscillators 202a-n are configured to have different configurations when operating in the break phase lock state. In other words, the ring oscillator elements from each of the ring oscillators 202a-n are connected together differently when operating in the break phase lock state. For example, if the ring oscillator 202a is configured as 7 single ring oscillator loops, ring oscillator 202b may be configured as 2 single ring oscillators loops and a series connected ring oscillator with 5 inverters in a loop, and ring oscillator 202n may be configured as a single ring oscillator loop and 2 series connected ring oscillators with 3 inverters in a loop. Thus, all of the ring oscillators 202a-n, when operating in the break phase lock state, have the different configurations. In alternative embodiments, the ring oscillators 202a-n may be configured in other configurations, but they all will have different configurations from one another during the break phase lock state. Thus, any potential interlock in phases between the ring oscillators 202a-n is broken during the break phase lock state.

Figure 4:
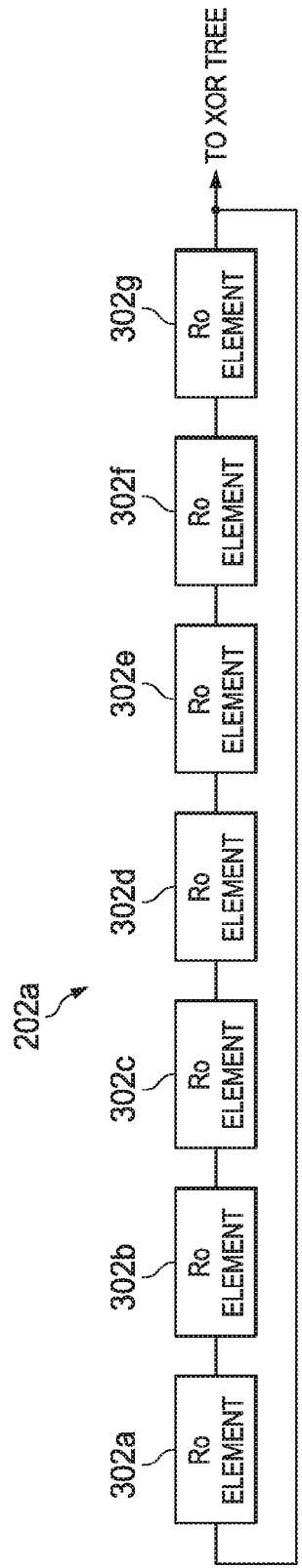
FIG. 4 shows an illustrative block diagram of a single ring oscillator of a TRNG core operating in an accumulate entropy state in accordance with various embodiments.

FIG. 4 shows a configuration of ring oscillator 202a of TRNG core 50 operating in an accumulate entropy state in accordance with various embodiments. As discussed above, when operating in the accumulate entropy phase, each of the ring oscillators 202a-n have the same configurations. In the example shown in FIG. 4, ring oscillator 202a includes each of the ring oscillator elements 302a-g connected in series in a single loop. Thus, the output of ring oscillator element 302a serves as the input to ring oscillator 302b; the output of ring oscillator element 302b serves as the input to ring oscillator element 302c; the output of ring oscillator element 302c serves as the input to ring oscillator element 302d; the output of ring oscillator element 302d serves as the input to ring oscillator element 302e; the output of ring oscillator element 302e serves as the input to ring oscillator element 302f; the output of ring oscillator element 302f serves as the input to ring oscillator element 302g; and the output of ring oscillator element 302g serves as the input to ring oscillator element 302a. Because, during the accumulate entropy state, all of the other ring oscillators 202b-n have the same configuration, entropy is accumulated to generate random bits.

Figure 5:
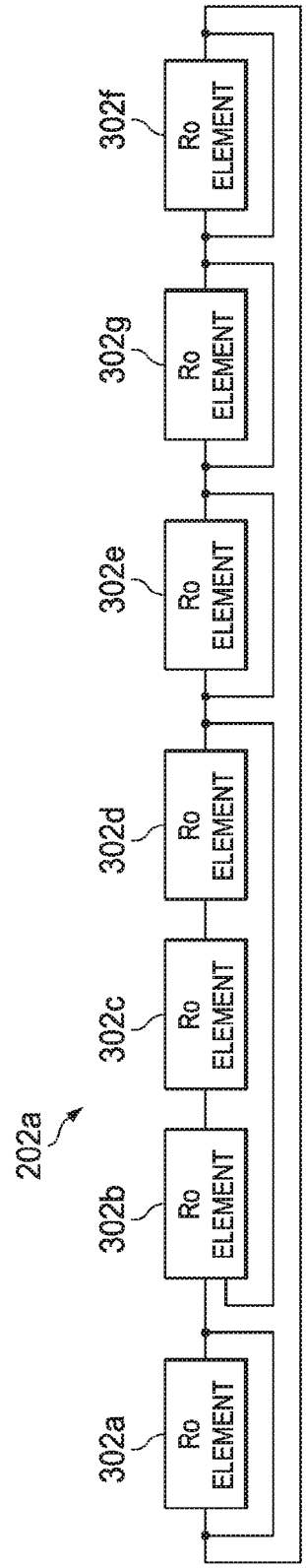
FIG. 5 shows an illustrative block diagram of a ring oscillator of a TRNG core operating in a break phase lock state in accordance with various embodiments.

FIG. 5 shows a single example of a configuration of ring oscillator 202a of TRNG core 50 operating in a break phase lock state in accordance with various embodiments. As discussed above, when operating in the break phase lock state, each of the ring oscillators 202a-n have different configurations. The example shown in FIG. 5 is one such possible configuration. In this example, the ring oscillator 202a includes each of the ring oscillator elements 302a-g connected in multiple different ring oscillator loops. For example, the output of ring oscillator element 302a serves as its input. Thus the ring oscillator element 302a serves as a ring oscillator loop with a single inverter (a single ring oscillator element loop). Similarly, ring oscillators 302e-f also serve as single ring oscillator element loops (i.e., the output of the ring oscillator element 302e serves as the ring oscillator element 302e input, etc.). However, ring oscillator elements 302b-d form a ring oscillator loop that includes three inverters in series. Thus, the output of ring oscillator element 302b is the input of ring oscillator element 302c; the output of ring oscillator element 302c is the input of ring oscillator element 302d; and the output of ring oscillator element 302d is the input of ring oscillator element 302b. Thus, in this configuration, 5 separate ring oscillator loops are generated in the single ring oscillator 202a. Because the remaining ring oscillators in the TRNG core 50 have different configurations (i.e., the ring oscillator elements are connected in a different manner), any potential interlock in phase between the ring oscillators 202a-n is prevented or broken during the break phase lock state.

FIG. 6 shows an illustrative state diagram 600 of the states provided by FSM 104 of controller 100 configured to break phase lock between ring oscillators 202a-n in TRNG core 50 in accordance with various embodiments. As discussed above, FSM 104 is configured to toggle between the accumulate entropy state 602 and the break phase lock state 604. Once the accumulate entropy state 602 begins, a timer, labelled as timer A in FIG. 6 begins. Timer A is programmable (e.g., external computing device 80 may program the amount of time for timer A). Once the programmable time elapses from timer A, the FSM 104 toggles from the accumulate entropy state 602 to the break phase lock state 604 and provides control signal 128 to the configuration circuit 102 to configure the ring oscillators 202a-n in the TRNG core 50 in accordance with the configuration parameters 122 for the break phase lock state (i.e., ring oscillator elements of the ring oscillators 202a-n are connected to one another in different configurations).

Once the break phase lock state 604 begins, a timer, labelled as timer B in FIG. 6 begins. Timer B is programmable (e.g., external computing device 80 may program the amount of time for timer B). Once the programmable time elapses from timer B, the FSM 104 toggles from the break phase lock state 604 to the accumulate entropy state 602 and provides control signal 128 to the configuration circuit 102 to configure the ring oscillators 202a-n in the TRNG core 50 in accordance with the configuration parameters 122 for the accumulate entropy state (i.e., ring oscillator elements of the ring oscillators 202a-n are connected to one another in the same configuration).

FIG. 7 shows a flow diagram illustrating aspects of operations that may be performed to break a phase lock between ring oscillators in a TRNG core in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 700 may be provided by instructions executed by the controller 100, external computing device 80, and/or TRNG core 50.

The method 700 begins in block 702 with toggling a ring oscillator, such as ring oscillator 202a, from an accumulate entropy state to a break phase lock state. For example, FSM 104 may toggle between two states, the accumulate entropy state and the break phase lock state. As the FSM 104 toggles from the accumulate entropy state to the break phase lock state, a control signal, such as control signal 128 is generated by the FSM 104 and provided to a configuration circuit, such as configuration circuit 102. The configuration circuit then asserts a control signal, such as control signal 126, to the TRNG core 50 causing the ring oscillators 202a-n in the TRNG core 50 to toggle from the accumulate entropy state to the break phase lock state.

In block 704, the method 700 continues with generating control signals, such as the control signals 126, so that the ring oscillator forms a plurality of ring oscillator element loops. For example, once the ring oscillator toggles from the accumulate entropy state to the break phase lock state, the control signals 126 may cause the ring oscillator to configure in a break phase lock configuration. In other words, the BPL register 310 may provide an assert signal 322 to multiplexers 304a-n in ring oscillator elements 302a-n of the ring oscillator to configure the ring oscillator elements 302a-n into a configuration that is not a single ring oscillator loop with inverters in series with one another. Thus, the ring oscillator elements 302a-n may be configured in a variety of different manners (e.g., 7 single ring oscillator loops, 2 single ring oscillator loops and a series connected ring oscillator loop with 5 inverters, and a single ring oscillator loop and 2 series connected ring oscillator loops with 3 inverters, etc.).

The method 700 continues in block 706 with toggling the ring oscillator from the break phase lock state to the accumulate entropy state. For example, as the FSM 104 toggles from the break phase lock state to the accumulate entropy state, a control signal, such as control signal 128 is generated by the FSM 104 and provided to the configuration circuit, such as configuration circuit 102. The configuration circuit then asserts the control signal, such as control signal 126, to the TRNG core 50 causing the ring oscillators 202a-n in the TRNG core 50 to toggle from the break phase lock state to the accumulate entropy state.

In block 708, the method 700 continues with generating control signals to form a single ring oscillator loop. For example, once the ring oscillator toggles from the break phase lock state to the accumulate entropy state, the control signals 126 may cause the ring oscillator to configure in a accumulate entropy configuration. In other words, the AE register 308 may provide an assert signal 322 to multiplexers 304a-n in ring oscillator elements 302a-n of the ring oscillator to configure the ring oscillator elements 302a-n into a configuration that is a single ring oscillator loop with inverters in series with one another.

FIG. 8 shows a flow diagram illustrating aspects of operations that may be performed to break a phase lock between ring oscillators in a TRNG core in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 800 may be provided by instructions executed by the controller 100, external computing device 80, and/or TRNG core 50.

The method 800 begins in block 802 with toggling all ring oscillators in a TRNG core, such as ring oscillators 202a-n, from an accumulate entropy state to a break phase lock state. For example, FSM 104 may toggle between two states, the accumulate entropy state and the break phase lock state. As the FSM 104 toggles from the accumulate entropy state to the break phase lock state, a control signal, such as control signal 128 is generated by the FSM 104 and provided to a configuration circuit, such as configuration circuit 102. The configuration circuit then asserts a control signal, such as control signal 126, to the TRNG core 50 causing the ring oscillators 202a-n in the TRNG core 50 to toggle from the accumulate entropy state to the break phase lock state.

In block 804, the method 800 continues with generating control signals, such as the control signals 126, for each ring oscillator so that each ring oscillator forms a plurality of ring oscillator element loops that are different from one another. For example, once the ring oscillators 202a-n toggle from the accumulate entropy state to the break phase lock state, the control signals 126 may cause the ring oscillators to configure in a break phase lock configuration. In other words, BPL registers, including BPL register 310, may provide an assert signals to multiplexers in each ring oscillator element of all of the ring oscillators to configure the ring oscillator elements into a configuration that is not a single ring oscillator loop with inverters in series with one another. Thus, the ring oscillator elements of each ring oscillator may be configured in a variety of different manners (e.g., 7 single ring oscillator loops, 2 single ring oscillator loops and a series connected ring oscillator loop with 5 inverters, and a single ring oscillator loop and 2 series connected ring oscillator loops with 3 inverters, etc.). Hence, the ring oscillator elements are connected to one another in a different manner from one ring oscillator to the next. For example, the ring oscillator elements in ring oscillator 202a may be connected with 7 single ring oscillator loops while the ring oscillator elements in ring oscillator 202b may be connected with 2 single ring oscillator loops and a series connected ring oscillator loop with 5 inverters.

The method 800 continues in block 806 with determining whether a break phase lock timer has elapsed. For example, an external computing device 80 may generate configuration parameters that provide a timer to the FSM 104 for how long the break phase lock state lasts. As soon as the FSM 104 toggles to the break phase lock state, this break phase lock timer begins. If a determination is made in block 806 that the a break phase lock timer has not elapsed, the method 800 continues back in block 804 with generating the control signals for each ring oscillator so that each ring oscillator forms a plurality of ring oscillator element loops that are different from one another.

However, if, in block 806, a determination is made that the break phase lock timer has elapsed, the method 800 continues in block 808 with toggling all of the ring oscillators in the TRNG core from the break phase lock state to the accumulate entropy state. For example, as the FSM 104 toggles from the break phase lock state to the accumulate entropy state, a control signal, such as control signal 128 is generated by the FSM 104 and provided to the configuration circuit, such as configuration circuit 102. The configuration circuit then asserts the control signal, such as control signal 126, to the TRNG core 50 causing the ring oscillators 202a-n in the TRNG core 50 to toggle from the break phase lock state to the accumulate entropy state.

In block 810, the method 800 continues with generating control signals for each ring oscillator in the TRNG core 50 to form a single ring oscillator loop. For example, once the ring oscillators toggle from the break phase lock state to the accumulate entropy state, the control signals 126 may cause the ring oscillators to configure in a accumulate entropy configuration. In other words, the AE registers corresponding with each ring oscillator may provide an assert signal to multiplexers in the ring oscillator elements of the ring oscillators 202a-n to configure the ring oscillator elements in each of the ring oscillators into a single ring oscillator loop with inverters in series with one another configuration.

In block 812, the method 800 continues with determining whether an accumulate entropy timer has elapsed. For example, an external computing device 80 may generate configuration parameters that provide a timer to the FSM 104 for how long the accumulate entropy state lasts. As soon as the FSM 104 toggles to the accumulate entropy state, this accumulate entropy timer begins. If a determination is made in block 812 that the accumulate entropy timer has not elapsed, the method 800 continues back in block 810 with generating the control signals for each ring oscillator so that each ring oscillator forms a single ring oscillator loop with inverters in series with one another. However, in block 812, a determination is made that the accumulate entropy timer has elapsed, the method 800 continues in block 802 with toggling all of the ring oscillators in the TRNG core from the accumulate entropy state to the break phase lock state.

Figure 9:
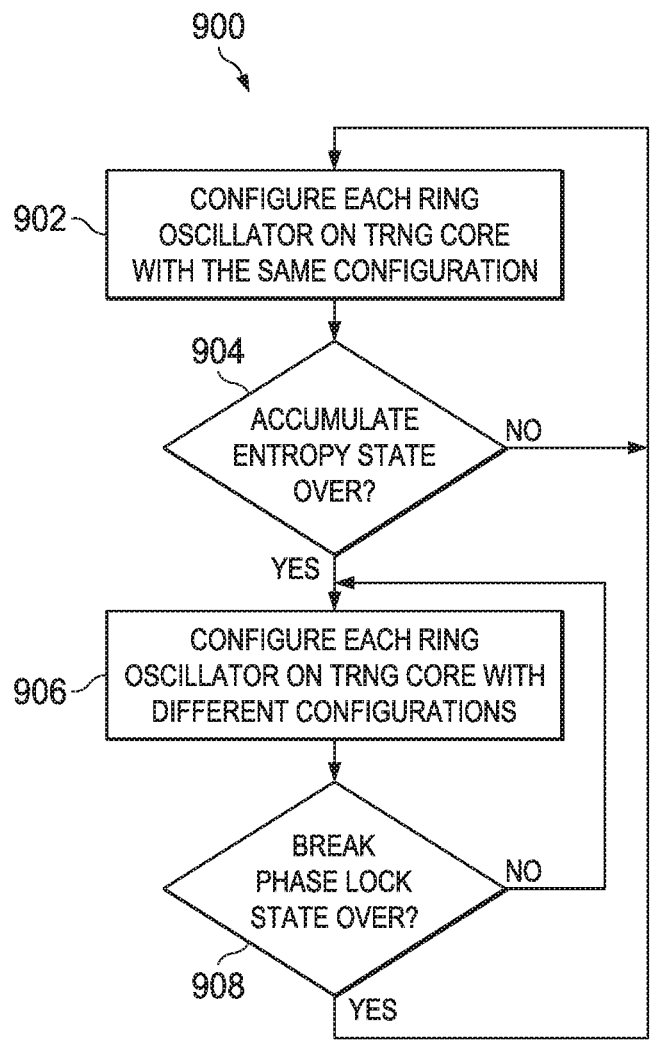
FIG. 9 shows a flow diagram illustrating aspects of operations that may be performed to break a phase lock between ring oscillators in a TRNG core in accordance with various embodiments.

FIG. 9 shows a flow diagram illustrating aspects of operations that may be performed to break a phase lock between ring oscillators in a TRNG core in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 900 may be provided by instructions executed by the controller 100, external computing device 80, and/or TRNG core 50.

The method 900 begins in block 902 with configuring each ring oscillator in a TRNG core, such as ring oscillators 202a-n with the same configuration. For example, AE registers corresponding with each ring oscillator may provide an assert signal to multiplexers in the ring oscillator elements of the ring oscillators 202a-n to configure the ring oscillator elements in each ring oscillator into a single ring oscillator loop with inverters in series with one another configuration.

In block 904, the method 900 continues with determining whether an accumulate entropy state is over. For example, an external computing device 80 may generate configuration parameters that provide a period of time to the FSM 104 for how long the accumulate entropy state lasts. As soon as the FSM 104 toggles to the accumulate entropy state, this accumulate entropy time begins. Once the time provided by the external computing device 80 has elapsed, the FSM 104 toggles from the accumulate entropy state to the break phase lock state, thus ending the accumulate entropy state.

If, in block 904, a determination is made that the accumulate entropy state is not over, the method 900 continues back in block 902 with configuring each ring oscillator with the same configuration. However, if in block 904 a determination is made that the accumulate entropy state is over, the method 900 continues in block 906 with configuring the ring oscillators in the TRNG core with different configurations. For example, BPL registers corresponding with each ring oscillator may provide an assert signal to multiplexers in the ring oscillator elements of the ring oscillators 202a-n to configure the ring oscillator elements into a configuration that is not a single ring oscillator loop with inverters in series with one another. Thus, the ring oscillator elements may be configured in a variety of different manners (e.g., 7 single ring oscillator loops, 2 single ring oscillator loops and a series connected ring oscillator loop with 5 inverters, and a single ring oscillator loop and 2 series connected ring oscillator loops with 3 inverters, etc.). The ring oscillator elements are connected to one another in a different manner from one ring oscillator to the next. For example, the ring oscillator elements in ring oscillator 202a may be connected with 7 single ring oscillator loops while the ring oscillator elements in ring oscillator 202b may be connected with 2 single ring oscillator loops and a series connected ring oscillator loop with 5 inverters.

In block 908, the method 900 continues with determining whether a break phase lock state is over. For example, an external computing device 80 may generate configuration parameters that provide a period of time to the FSM 104 for how long the break phase lock state lasts. As soon as the FSM 104 toggles to the break phase lock state from the accumulate entropy state, this break phase lock time begins. Once the time provided by the external computing device 80 has elapsed, the FSM 104 toggles from the break phase lock state to the accumulate entropy state, thus ending the break phase lock state.

If, in block 908, a determination is made that the break phase lock state is not over, the method 900 continues back in block 906 with configuring the ring oscillators with the different configurations. However, if in block 908 a determination is made that the break phase lock state is over, the method 900 continues back in block 902 with configuring each ring oscillator in the TRNG core with the same configuration.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
   a random number generator (RNG) core that includes a plurality of parallel connected ring oscillators, each of the plurality of parallel connected ring oscillators including a same number of connected ring oscillator elements, each ring oscillator element including an inverter and a multiplexer connected to an input of the inverter; and
   a finite state machine circuit coupled to the RNG core, the finite state machine circuit configured to cause each of the parallel connected ring oscillators to operate in an accumulate entropy state for a first period of time and a break phase lock state for a second period of time;
   wherein, when operating in the accumulate entropy state, the ring oscillator elements of all of the plurality of parallel connected ring oscillators are logically coupled to one another in a same configuration; and
   wherein, when operating in the break phase lock state, the ring oscillator elements of each of the parallel connected ring oscillators are logically coupled to one another in a different configuration than the other ring oscillators.

2. The device of claim 1, further comprising, for each of the plurality of parallel connected ring oscillators, an accumulate entropy control register connected to each multiplexer in the ring oscillator and a break phase lock control register connected to each multiplexer in the ring oscillator, wherein, when operating in the accumulate entropy state, the accumulate entropy control register causes each multiplexer to select, as an input to each inverter, an immediately previous inverter output signal.

3. The device of claim 1, wherein the first period of time is longer than the second period of time.

4. The device of claim 1, wherein, when operating in the break phase lock state:
   a first ring oscillator of the plurality of parallel connected ring oscillators includes a first number of ring oscillator element loops; and
   a second ring oscillator of the plurality of parallel connected ring oscillators includes a second number of ring oscillator element loops, the first number of ring oscillator element loops being different than the second number of ring oscillator element loops.

5. A device comprising:
   a plurality of configurable parallel connected ring oscillators; and
   a finite state machine circuit coupled to the plurality of configurable parallel connected ring oscillators, the finite state machine configured to cause each of the configurable parallel connected ring oscillators to operate in an accumulate entropy state for a first period of time and a break phase lock state for a second period of time;
   wherein, when operating in the accumulate entropy state, all of the plurality of configurable parallel connected ring oscillators are in a same configuration; and
   wherein, when operating in the break phase lock state, each of the plurality of configurable parallel connected ring oscillators are in a different configuration than all other of the plurality of configurable connected ring oscillators.

6. The device of claim 5, wherein each of the configurable parallel connected ring oscillators includes a plurality of connected ring oscillator elements, each ring oscillator element including an inverter and a multiplexer connected to an input of the inverter.

7. The device of claim 6, wherein an output of an inverter in a first ring oscillator element is connected to a multiplexer in a first subsequent ring oscillator element, the multiplexer in the first subsequent ring oscillator element further connected to an output of an inverter of the first subsequent ring oscillator element or an output of an inverter of a second subsequent ring oscillator element.

8. The device of claim 7, wherein, when operating in the accumulate entropy state, the multiplexer of the first subsequent ring oscillator element is configured to select the output of the inverter in the first ring oscillator element as input to the inverter in the first subsequent ring oscillator element.

9. The device of claim 7, wherein, when operating in the break phase lock state, the multiplexer of the first subsequent ring oscillator element is configured to select the output of the inverter in the first subsequent ring oscillator element.

10. The device of claim 7, wherein, when operating in the break phase lock state, the multiplexer of the first subsequent ring oscillator element is configured to select the output of the inverter of the second subsequent ring oscillator.

11. The device of claim 5, wherein a first ring oscillator of the plurality of configurable parallel connected ring oscillators comprises:
   when operating in the accumulate entropy state, a first ring oscillator element loop connected in series; and when operating in the break phase lock state, a first plurality of ring oscillator element loops.

12. The device of claim 11, wherein a second ring oscillator of the plurality of configurable parallel connected ring oscillators comprises:
when operating in the accumulate entropy state, a second ring oscillator element loop connected in series; and
when operating in the break phase lock state, a second plurality of ring oscillator element loops, the second plurality of ring oscillator element loops being different than the first plurality of ring oscillator element loops.

13. The device of claim 12, wherein:
a number of ring oscillator elements in the first and second ring oscillator element loops is equal; and
a number of elements in each loop of the first and second plurality of ring oscillator element loops is odd.

14. The device of claim 13, the number of elements in each loop of the first and second plurality of ring oscillator element loops is programmable.

15. The device of claim 5, wherein, when operating in the break phase lock state, each of the configurable parallel connected ring oscillators include a single or multiple ring oscillator element loops.

16. The device of claim 5, wherein the first period of time and the second period of time is programmable in the finite state machine circuit.

17. A method, comprising:
toggling a first ring oscillator from an accumulate entropy state to a break phase lock state;
in response to the toggling the first ring oscillator from the accumulate entropy state to the break phase lock state, configuring the first ring oscillator to include a first plurality of ring oscillator element loops;
toggling the first ring oscillator from the break phase lock state to the accumulate entropy state;
in response to the toggling the first ring oscillator from the break phase lock state to the accumulate entropy state, configuring the first ring oscillator to include a first single ring oscillator element loop.

18. The method of claim 17, further comprising:
toggling a second ring oscillator from the accumulate entropy state to the break phase lock state;
in response to the toggling the second ring oscillator from the accumulate entropy state to the break phase lock state, configuring the second ring oscillator to include a second plurality of ring oscillator element loops;
toggling the second ring oscillator from the break phase lock state to the accumulate entropy state;
in response to the toggling the second ring oscillator from the break phase lock state to the accumulate entropy state, configuring the second ring oscillator to include a second single ring oscillator element loop.

19. The method of claim 18, wherein the first plurality of ring oscillator element loops is in a different configuration than the second plurality of ring oscillator element loops.

20. The method of claim 18, wherein the first plurality of ring oscillator element loops contains a different number of loops than the second plurality of ring oscillator element loops.

* * * * *